(12) United States Patent
Wang et al.

(10) Patent No.: US 6,489,035 B1
(45) Date of Patent: *Dec. 3, 2002

(54) APPLYING RESISTIVE LAYER ONTO COPPER

(75) Inventors: Jiangtao Wang, Cleveland Heights, OH (US); John Callahan, Mentor, OH (US); Dan Lillie, Bedford, OH (US)

(73) Assignee: Gould Electronics Inc., Eastlake, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 09/628,766

(22) Filed: Jul. 31, 2000

Related U.S. Application Data

(63) Continuation-in-part of application No. 09/500,192, filed on Feb. 8, 2000.

(51) Int. Cl.⁷ .................. B32B 15/04; C23C 16/00; C25D 11/00
(52) U.S. Cl. .................. 428/469; 428/607; 428/612; 428/472; 205/125; 205/156; 205/333; 427/252
(58) Field of Search .................. 428/606, 607, 428/612, 627, 629, 632, 639, 658, 666, 472, 469; 427/406, 252, 404, 405, 419.1, 419.2, 419.7; 205/156, 176, 177, 178, 179, 180, 181, 125, 243–246, 283, 305, 333, 920

(56) References Cited

U.S. PATENT DOCUMENTS

| | | |
|---|---|---|
| 2,662,957 A | 12/1953 | Eisler |
| 3,368,919 A | 2/1968 | Casale et al. |
| 3,489,656 A | 1/1970 | Balde |
| 3,621,442 A | 11/1971 | Racht et al. |
| 3,742,120 A | 6/1973 | Keister et al. |
| 3,849,757 A | 11/1974 | Khammous et al. |
| 3,857,683 A | 12/1974 | Castonguay |
| 3,864,825 A | 2/1975 | Holmes |
| 4,164,607 A | 8/1979 | Thiel et al. |
| 4,203,025 A | 5/1980 | Nakatani et al. |

(List continued on next page.)

FOREIGN PATENT DOCUMENTS

| | | | |
|---|---|---|---|
| EP | 0 007 598 | 2/1980 | |
| GB | 690691 | 4/1953 | |
| JP | 58-7077 | 7/1981 | |
| JP | 04-285192 | 10/1992 | |
| JP | 58095301 | 6/1993 | ............ G02B/5/08 |
| JP | 05-235542 | 9/1993 | |
| JP | 05275817 A | * 10/1993 | |
| JP | 406120630 A | * 4/1994 | |
| JP | 07-170064 | 7/1995 | |
| JP | 08235540 | 9/1996 | ............ G11B/5/39 |
| WO | WO 92/00405 | 1/1992 | |

OTHER PUBLICATIONS

U.S. patent application Ser. No. 09/667,294 entitled: Resistor Component with Multiple Layers of Resistive Material; Jiangtao Wang et al., filed on Sep. 22, 2000, specification—12 pages, drawings—4 sheets.

U.S. patent application Ser. No. 09/921,064 entitled: Resistor Component with Multiple Layers of Resistive Material; Jiangtao Wang et al., filed on Aug. 2, 2001, specification—12 pages, drawings—4 sheets.

(List continued on next page.)

*Primary Examiner*—Deborah Jones
*Assistant Examiner*—Jennifer McNeil
(74) *Attorney, Agent, or Firm*—Mark Kusper; Michael A. Jaffe

(57) ABSTRACT

A sheet material, comprised of a copper foil treated to have a stabilization layer thereon. The stabilization layer is comprised of zinc oxide, chromium oxide or a combination thereof having a thickness between about 5 Å and about 70 Å. A vapor deposited resistive material is provided on the stabilization layer.

18 Claims, 5 Drawing Sheets

U.S. PATENT DOCUMENTS

| | | |
|---|---|---|
| 4,396,900 A | 8/1983 | Hall |
| 4,482,882 A | 11/1984 | Luder et al. |
| 4,517,546 A | 5/1985 | Kakuhashi et al. |
| 4,585,537 A | 4/1986 | Nakayama et al. |
| 4,617,575 A | 10/1986 | Fuyama et al. |
| 4,892,776 A | 1/1990 | Rice |
| 5,038,132 A | 8/1991 | Lindblom et al. |
| 5,039,570 A | 8/1991 | Sturm |
| 5,128,008 A | 7/1992 | Chen et al. |
| 5,172,473 A | 12/1992 | Burns et al. |
| 5,243,320 A | 9/1993 | Clouser et al. |
| 5,366,814 A * | 11/1994 | Yamanishi et al. |
| 5,389,446 A | 2/1995 | Yamanishi et al. |
| 5,456,817 A * | 10/1995 | Hino et al. |
| 5,552,234 A * | 9/1996 | Kawasumi |
| 5,689,227 A | 11/1997 | Nguyen et al. |
| 5,700,362 A * | 12/1997 | Yano et al. |
| 5,709,957 A | 1/1998 | Chiang et al. |
| 5,863,666 A | 1/1999 | Merchant et al. |
| 5,885,436 A * | 3/1999 | Ameen et al. |
| 5,908,544 A | 6/1999 | Lee et al. |
| 6,132,589 A * | 10/2000 | Ameen et al. |

OTHER PUBLICATIONS

U.S. patent application Ser. No. 09/921,074 entitled: Resistor Component with Multiple Layers of Resistive Material; Jiangtao Wang et al., filed on Aug. 2, 2001, specification—12 pages, drawings—4 sheets.

"Structure and Magnetic Properties of FE1–XNIX/CU Invar Superlattices," Tang et al., Journal of Applied Physics, US, American Institute of Physics, New York, vol. 80, No. 4, Aug. 15, 1996, pp. 2327–2333, XP000633333.

"Transmission Electron Microscope Study of Thin Cu–Ni Laminates Obtained by Vapor Deposition," Nakahara et al., International Conference on Metallurgical Coatings, San Diego, CA, US, Apr. 21–25, 1980, vol. 72, No. 2, pp. 277–284, XP000993586.

* cited by examiner

US 6,489,035 B1

APPLYING RESISTIVE LAYER ONTO COPPER

This application is a continuation-in-part of co-pending application Ser. No. 09/500,192 filed on Feb. 8, 2000.

FIELD OF THE INVENTION

This invention relates to a process for treating copper and, more particularly, to a process for applying a metal to at least one side of a copper foil.

BACKGROUND OF THE INVENTION

Copper foil is used in the production of printed circuit boards. In the production of printed circuit boards, it is generally necessary to bond a copper foil to a dielectric substrate to provide the foil with dimensional and structural stability. Although an excellent electronic conductor, there are problems inherent with the use of copper foil. For example, copper is easily oxidized and corroded, and copper itself, whether plated or rolled, does not adhere well to such substrates. Copper is also known to accelerate or catalyze the decomposition of the dielectric substrates. For these reasons, copper foil is typically sold with one or more protective layers applied to its surface.

It is known that a thin, chromium layer deposited onto copper foil has many applications for printed circuit boards. There are two ways to deposit the thin chromium layer onto a copper surface. One is by an electrodeposition process, and the other is by a vacuum deposition process.

The electrodeposition process has several disadvantages. Foremost, the process uses environmentally hazardous material that is difficult and costly to handle and dispose of Further, this type of process is inexact and inefficient.

With respect to the vacuum deposition process, in order to insure a satisfactory adhesion between the applied chromium and copper, an extensive and rigorous pre-treatment of the copper is required to remove copper oxide from the surface thereof prior to the vacuum deposition of the chromium.

The present invention overcomes these and other problems and provides a method of forming a metal-coated copper by a vacuum deposition process that does not require an extensive rigorous pre-treatment process.

SUMMARY OF THE INVENTION

In accordance with the present invention, there is provided a method of applying a resistive material onto a copper layer, comprising the steps of:

stabilizing a surface of a copper layer by applying a stabilization layer thereto, the stabilization layer comprised of zinc oxide, chromium oxide, nickel, nickel oxide or a combination thereof and having a thickness of between about 5 Å and about 70 Å;

and vapor depositing a resistive material onto the stabilized surface of the copper layer.

In accordance with another aspect of the present invention, there is provided a sheet material, comprised of a reverse treated copper foil having a matte side and a treated shiny side that is treated to have micronodules formed thereon. A stabilization layer is provided on the treated, shiny side of the copper. The stabilization layer comprised of zinc oxide, chromium oxide or a combination thereof having a thickness between about 5 Å and about 70 Å. A vapor deposited resistive material is deposited on the stabilization layer.

It is an object of the present invention to provide a chromium coated copper layer for use in manufacturing printed circuit boards.

Another object of the present invention is to provide a method of forming a chromium coated copper layer as described above by a vacuum deposition process that does not require an extensive, rigorous pre-cleaning of the copper surface prior to deposition of the chromium.

Another object of the present invention is to provide a method of vacuum depositing a metal onto a copper surface.

A still further object of the present invention is to provide a generally continuous process as described above.

Another object of the present invention is to provide a copper component having a layer of resistive material thereon for use in manufacturing printed circuit boards.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
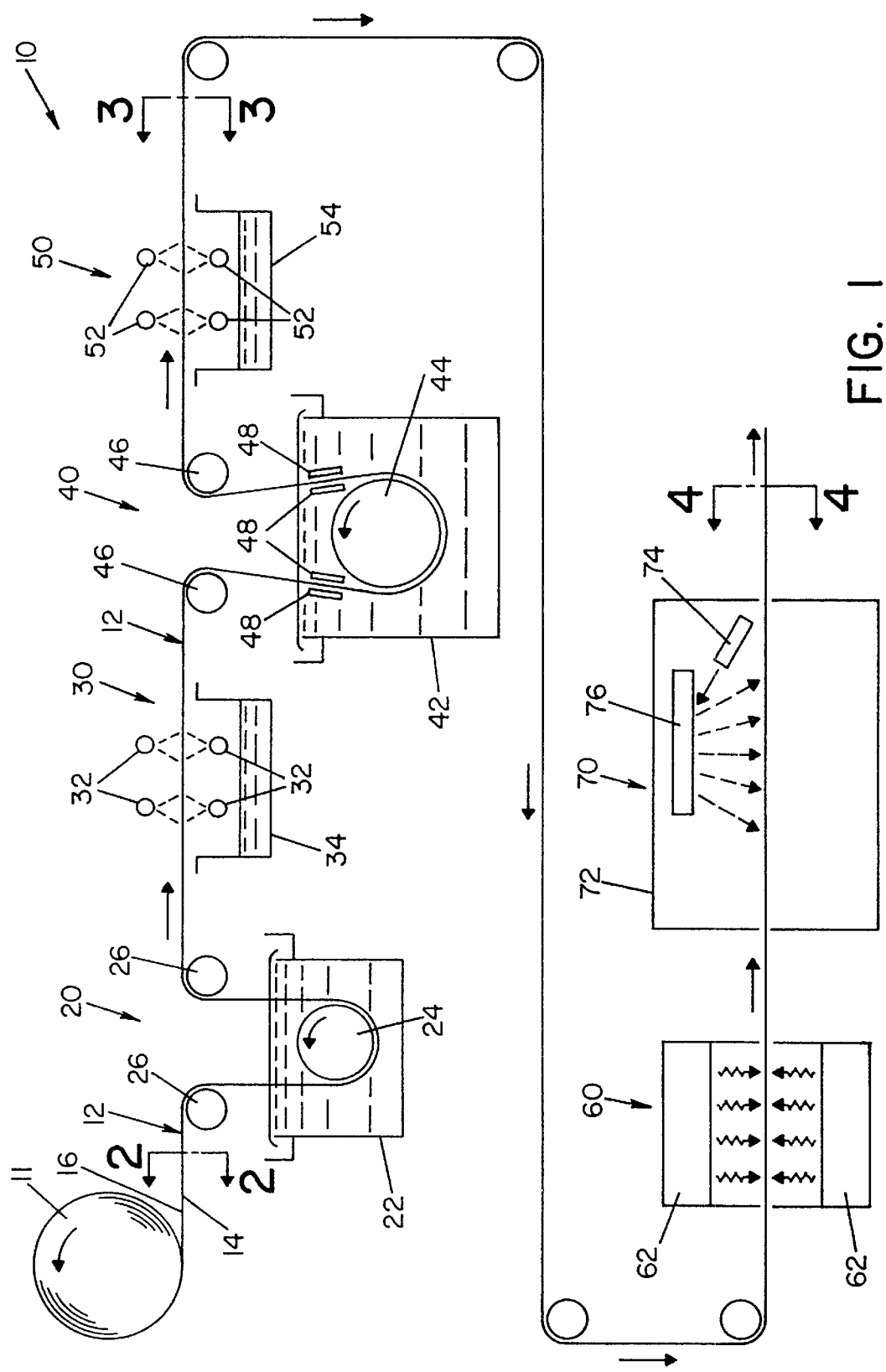
FIG. 1 is a schematic view of a process for applying a metal onto a surface of a copper foil in accordance with the present invention.

The present invention relates to a process for applying a metal onto a copper surface. As used herein the term "metal"

refers to metals and alloys capable of vacuum deposition by the methods disclosed herein. The invention is particularly applicable to applying chromium onto copper foil and will be described with particular reference thereto, it being appreciated however, that the disclosed process may also be used in applying a metal such as aluminum, nickel, copper, iron, indium, zinc, tantalum, tin, vanadium, tungsten, zirconium, molybdenum and alloys thereof onto copper foil.

The copper foils used with this invention can be made using one of two techniques. Wrought or rolled copper foil is produced by mechanically reducing the thickness of a copper or copper alloy strip or ingot by a process such as rolling. Electrodeposited foil is produced by electrolytically depositing copper ions on a rotating cathode drum and then peeling the deposited foil from the cathode. Electrodeposited copper foils find advantageous application with this invention.

The copper foils typically have nominal thicknesses ranging from about 0.0002 inch to about 0.02 inch. Copper foil thickness is sometimes expressed in terms of weight and typically the foils of the present invention have weights or thicknesses ranging from about ⅛ to about 14 ounces per square foot ($oz/ft^2$). Especially useful copper foils are those having weights of ⅓, ½, 1 or 2 $oz/ft^2$.

Electrodeposited copper foils have a smooth or shiny (drum) side and a rough or matte (copper deposit growth front) side. The stabilization layer applied by the inventive process can be applied to either side of the foil, and in some instances it is applied to both sides. In one embodiment, the layer applied by the inventive process is applied to the shiny side of the foil.

The side or sides of the foil, to which the layer applied by the inventive process overlies, can be a "standard-profile surface," low-profile surface" or "very-low-profile surface." Useful embodiments involve the use of foils with low-profile surfaces and very low-profile surfaces. The term "standard-profile surface" is used herein to refer to a foil surface having an $R_{tm}$ (IPC-MF-150F) of greater than 10.2 microns. The term "low-profile surface" refers to a foil surface having a $R_{tm}$ (IPC-MF-150F) of less than 10.2 $\mu$. The term "very-low-profile surface" refers to a foil surface having a $R_{tm}$ (IPC-MF-150F) of less than 5.1 $\mu$. $R_{tm}$ (IPC-MF-150F) is the mean of the maximum peak-to-valley vertical measurements from each of five consecutive sampling measurements, and can be measured using a SURTRONIC® 3 profilometer marketed by Rank Taylor Hobson, Ltd., Leicester, England.

It will be appreciated by those skilled in the art that the present invention not only applies to copper foil having a stabilization layer on a surface thereof, but also applies to copper layers that have been deposited or adhered to other substrates and that have a stabilization layer applied on a surface thereof, after deposition or before or after being adhered to another substrate. Such substrates include, but are not limited to, polyimide (see U.S. Pat. Nos. 5,685,970 and 5,681,443 which are expressly incorporated by reference herein), other polymeric substrates, organic substrates, aluminum (see U.S. Pat. No. 5,153,050 which is expressly incorporated by reference herein), metal substrates (see U.S. Pat. No. 5,674,596 which is expressly incorporated by reference herein) or laminates of copper and INVAR®.

Figure 2:
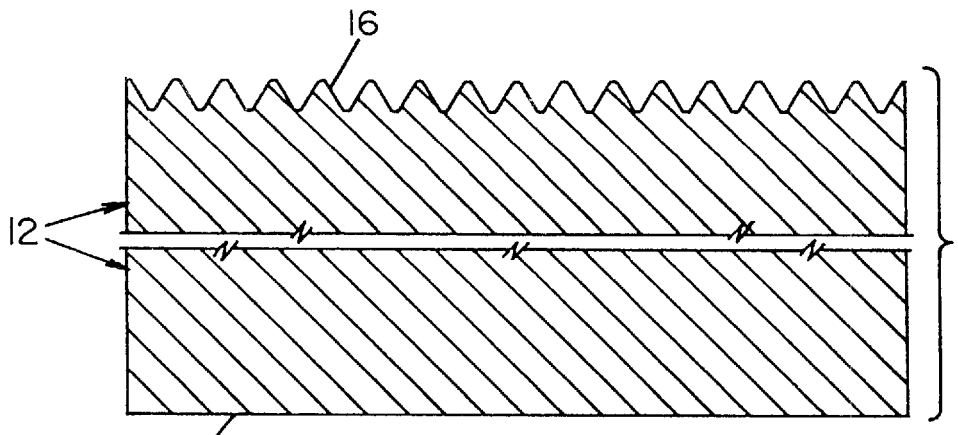
FIG. 2 is an enlarged sectional view taken along lines 2–2 of FIG. 1 showing a sheet of copper foil.

Referring now to the drawings wherein the showings are for the purpose of illustrating the preferred embodiment of the invention only, and not for the purpose of limiting same, FIG. 1 is a schematic view of a generally continuous manufacturing process 10 for applying a metal onto a copper surface illustrating a preferred embodiment of the present invention. In the embodiment shown, a roll 11 provides a generally continuous strip of copper foil 12. FIG. 2 is an enlarged cross-sectional view of copper foil 12. The copper foil 12 has a shiny side 14 and a matte side 16. (In the drawings, matte side 16 of copper foil 12 is shown exaggerated for the purpose of illustration).

Copper foil 12 preferably undergoes a first cleaning process, designated 20 in the drawings, to remove oxide film on the surfaces thereof. In the embodiment shown, copper foil 12 is conveyed into a tank 22 around a guide roll 24 by means of guide rollers 26. Tank 22 contains a cleaning solution to remove oxide film from the surfaces of copper foil 12. An acid solution is preferably used to remove the copper oxide layer from copper foil 12. A typical acid solution for cleaning copper foil 12 may include 10–80 g/l $H_2SO_4$. In one embodiment, 50 g/l $H_2SO_4$ is used to remove the copper oxide layer from copper foil 12.

After cleaning process 20, copper foil 12 undergoes a rinsing process, designated 30, wherein spray elements 32 disposed above and below copper foil 12 spray the surfaces of copper foil 12 with water. A tank 34 disposed beneath spray elements 32 collects the water sprayed therefrom.

Following cleaning process 20 and rinsing process 30, copper foil 12 undergoes a stabilization process, designated 40. Copper foil 12 is directed into a tank 42 and around a guide roll 44. Copper foil 12 is positioned relative to guide roll 44 by guide rollers 46. Tank 42 contains an electrolytic solution. In accordance with one embodiment of the present invention, the electrolytic solution contains zinc ions and chromium ions. The source of zinc ions for the electrolytic solution can be any zinc salt, examples include $ZnSO_4$, $ZnCO_3$, $ZnCrO_4$, etc. The source of chromium ions for the electrolytic solution can be any hexavalent chromium salt or compound, examples include $ZnCrO_4$, $CrO_3$, etc.

The concentration of zinc ions in the electrolytic solution is generally in the range of about 0.1 to about 2 g/l, preferably about 0.3 to about 0.6 g/l, and more preferably about 0.4 to about 0.5 g/l. The concentration of chromium ions in the electrolytic solution is generally in the range of about 0.3 to about 5 g/l, preferably about 0.5 to about 3 g/l, and more preferably about 0.5 to about 1.0 g/l.

In another embodiment, nickel oxide or nickel metal may also be deposited by itself or co-deposited with either zinc oxide or chromium oxide or both to form the stabilization layer. The source of nickel ions for the electrolytic solution can be any of the following individually or in combination: $Ni_2SO_4$, $NiCO_3$ etc.

The concentration of nickel ions in the electrolytic solution is generally in the range of about 0.2 g/l to about 1.2 g/l.

In another embodiment, other stabilization layers such as those containing phosphorous as is disclosed in U.S. Pat. No. 5,908,544, which is expressly incorporated by reference herein, may be used.

The electrolytic solution can include other conventional additives such as $Na_2SO_4$ at concentrations in the range of about 1 to about 50 g/l, preferably about 10 to about 20 g/l and more preferably about 12 to about 18 g/l. The pH of the electrolytic solution is generally in the range of about 3 to about 6, preferably about 4 to about 5, and more preferably about 4.8 to 5.0.

The temperature of the electrolytic solution is generally in the range of about 20° C. to about 100° C., preferably about 25° C. to about 45° C., and more preferably from about 26° C. to about 44° C.

Figure 3:
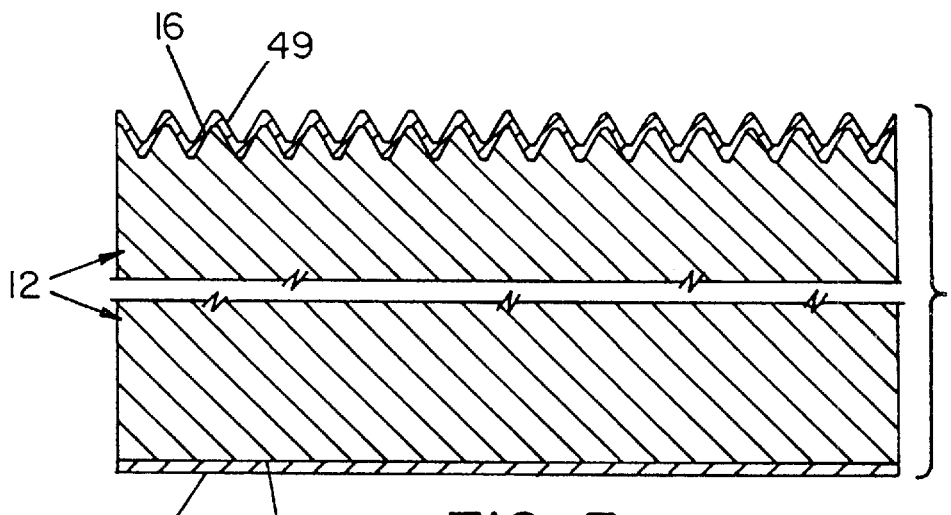
FIG. 3 is an enlarged sectional view taken along lines 3–3 of FIG. 1 showing the sheet of copper foil of FIG. 2 with stabilization layers thereon.
Figure 4:
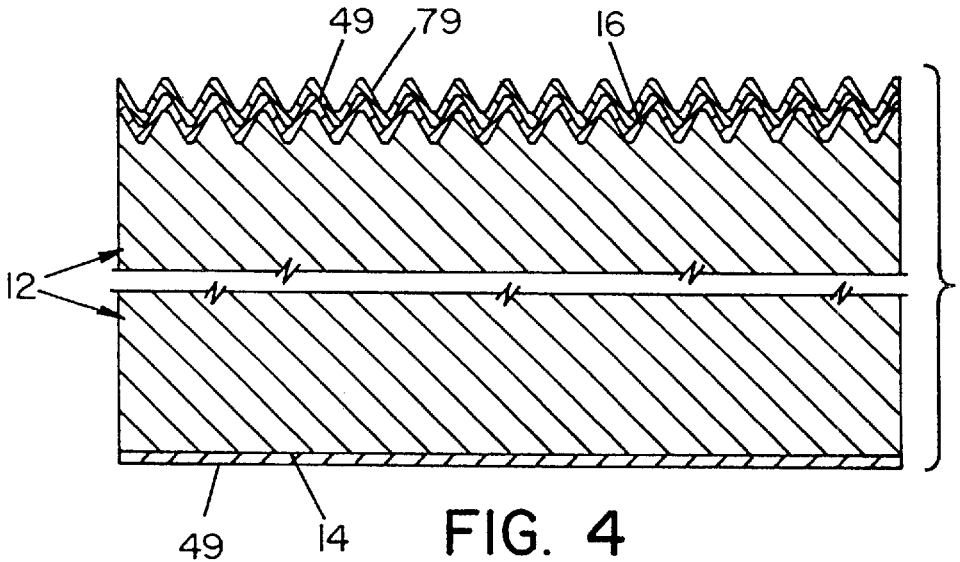
FIG. 4 is an enlarged sectional view taken along lines 4–4 of FIG. 1 showing a sheet of copper having a vapor deposited metal on the matte side thereof.

As seen in FIG. 1, anodes 48 are disposed adjacent to each side of copper foil 12 to apply a current density to copper foil 12. Guide rollers 46 are cathodic rollers wherein a stabilization layer 49 comprised of zinc oxide and chromium oxide is deposited on the exposed shiny side 14 and matte side 16 of copper foil 12 when anodes 48 are energized by a power source (not shown). FIG. 3 is a cross-sectional view showing copper foil 12 with stabilization layers 49 on shiny side 14 and matte side 16.

The current density is generally in the range of about 1 to about 100 amps/ft$^2$, preferably about 25 to about 50 amps/ft$^2$, and more preferably about 30 amps/ft$^2$. Where multiple anodes are employed, the current density may be varied between the anodes.

The plating time that is used is generally in the range of about 1 to about 30 seconds, preferably about 5 to about 20 seconds, and more preferably about 15 seconds. In one embodiment, the total treatment time on the shiny or smooth side is from about 3 to 10 seconds, and on the matte side is from about 1 to about 5 seconds.

In one embodiment, the mole ratio of chromium ions to zinc ions in the electrolytic solution is in the range of about 0.2 to about 10, preferably about 1 to about 5, and more preferably about 1.4.

In accordance with the present invention, the thickness of stabilization layers 49 that are applied to copper foil 12 are between about 5 Å to about 70 Å, and preferably about 20 Å to about 50 Å.

In the embodiment heretofore described, stabilization layer 49 is comprised of chromium oxide and zinc oxide. In accordance with another aspect of the present invention, stabilization layer 49 is comprised of only chromium oxide. The bath chemistries and process conditions for applying a chromium oxide stabilization layer are as follows:

1–10 g/l CrO$_3$ solution
Preferred 5 g/l CrO$_3$
pH-2
Bath temperature: 25° C.
10–30 amps/ft$^2$ for 5–10 seconds
or dip treatment: 10 seconds Following stabilization process 40, copper foil 12 with stabilization layers 49 thereon then undergoes a rinse process, designated 50 in the drawings. Spray elements 52, disposed above and below copper foil 12, spray water onto the surfaces of copper foil 12 (with stabilization layers 49) to rinse and clean the same and to remove any residual electrolytic solution therefrom. A tank 54 disposed below spray nozzles 52 collects the rinsing solution.

Copper foil 12 with stabilization layers 49 thereon undergoes a drying process 60 schematically shown in FIG. 1. In the embodiment shown, forced air dryers 62 are disposed above and below copper foil 12 to direct air onto copper foil 12 to dry the surface thereof.

In accordance with the present invention, following application of stabilization layers 49, a metal is vacuum deposited onto one or both stabilized surfaces of copper foil 12. In the embodiment shown in FIG. 1, the metal is applied to matte side 16 of copper foil 12. The metal may be any metal capable of vacuum deposition including those selected from the group consisting of aluminum, nickel, chromium, copper, iron, indium, zinc, tantalum, tin, vanadium, tungsten, zirconium, molybdenum and alloys thereof. In accordance with the present invention, the metal is vacuum deposited onto the stabilization layer 49 on copper foil 12 without additional cleaning or surface preparation. The metal is applied directly onto stabilization layer 49 by vacuum deposition techniques such as sputtering, chemical vapor deposition, electron beam deposition, thermal evaporation, ion plating (via substrate) or a combination of such processes. In the embodiment shown, a sputtering process 70 is schematically illustrated. As seen in FIG. 1, copper foil 12 with stabilization layers 49 thereon is conveyed into a deposition chamber designated 72. An electron beam gun 74 directs a stream of electrons at a target 76 comprised of a metal such that metallic species are knocked loose and deposited onto a surface of copper foil 12. In the embodiment shown, the deposition process applies a metal onto the matte side of copper foil 12. The applied metal preferably has a thickness of between about 50 Å and 5,000 Å. In the embodiment shown, a single target 76 is illustrated. As will be appreciated, multiple targets may be used and, if desired, the metal may be applied to both matte side 16 and shiny side 14 of foil 12.

In a preferred embodiment of the present invention, chromium is sputter deposited onto matte side 16 of copper foil 12 as an adhesion layer to enhance the adhesion of the copper foil to a substrate. It has been found that the foregoing process provides a chromium coated copper foil having good adhesive properties.

The following examples are provided for purposes of illustrating the invention. Unless otherwise indicated, in the following example as well as throughout the specification and claims, all parts and percentages are by weight, all temperatures are in degrees Celsius, and all pressures are atmospheric.

EXAMPLE 1

Both sides of raw electrodeposited copper foil ⅓ oz/ft$^2$, are pretreated with stabilization layers as follows:

Stabilization Treatment:
  0.53 g/l Zinc as ZnSO$_4$, 0.6 g/l Cr as CrO$_3$, 11 g/l Na$_2$SO$_4$
Bath pH: 5.0
Bath temperature: 42° C.
Current density: 8–15 amps/ft$^2$ for matte side
  2–2.5 amps/ft$^2$ for shiny side
Plating time: shiny side: 6–8 seconds
  matte side: 3–4 seconds Chromium is then applied to the stabilization layer(s) as follows:

Chromium Sputtering:
  14" sputter machine
Power: 5–8 kilowatts
Linear speed: 1.4 to 2.2 ft/min
Chromium Thickness: 1,200 Å for matte side
  1,300 Å for shiny side

EXAMPLE 2

Both sides of polyimide film are plated with copper (18 μ copper/50 μ polyimide film/5 μ copper; this product is one of a family of Gould®flex products manufactured by Gould Electronics Inc.) and treated as follows:

Stabilization Treatment:
  0.53 g/l Zinc as ZnSO$_4$, 0.6 g/l Cr as CrO$_3$, 11 g/l Na$_2$SO$_4$
Bath pH: 5.0
Bath temperature: 42° C.
Current density: 25 amps/ft$^2$ for both sides
Plating time: for either or both sides: 3–8 seconds Chromium is then applied to the stabilization layer(s) as follows:

Chromium Sputtering:
  14" sputter machine
Power: 5–8 kilowatts
Linear speed: 1.8 to 2.8 ft/min
Chromium Thickness: 1,000 Å for 18 μ copper side
No chromium applied to 5 μ copper side

EXAMPLE 3

Both sides of polyimide film are plated with copper (18 μ copper/50 μ polyimide film/5 μ copper; this product is one of a family of Gould®flex products manufactured by Gould Electronics Inc.) and treated as follows:
  Stabilization Treatment:
    5 g/l Cr as $CrO_3$
  Bath pH: 2.0
  Bath temperature: 25° C.
    Dip treatment
  Chromium is then applied to the stabilization layer(s) as follows:
  Chromium Sputtering:
    14" sputter machine
  Power: 5–8 kilowatts
  Linear speed: 1.8 to 2.8 ft/min
  Chromium Thickness: 1,000 Å for 18 μ copper side

EXAMPLE 4

Both sides of electroplated 8 μ copper on INVAR® (8 μCu/1.5 mil INVAR®/8 μCu), are pretreated with stabilization layers as follows:
  Stabilization Treatment:
    0.53 g/l Zinc as $ZnSO_4$, 0.6 g/l Cr as $CrO_3$, 11 g/l $Na_2SO_4$
  Bath pH: 5.0
  Bath temperature: 42° C.
  Current density: 25 amps/ft$^2$
  Plating time: 3–4 seconds
  Chromium is then applied to the stabilization layer(s) as follows:
  Chromium Sputtering:
    14" sputter machine
  Power: 5–8 kilowatts
  Linear speed: 1.8 to 2.8 ft/min
  Chromium Thickness: 1,000 Å for 8 μ copper side The foregoing text and Examples disclose applying a metal adhesion-coating layer onto a conventional copper foil sheet. The present invention also finds advantageous application in applying a layer of a resistive material onto a copper foil for use as a resistive foil in a printed circuit board.

Figure 5:
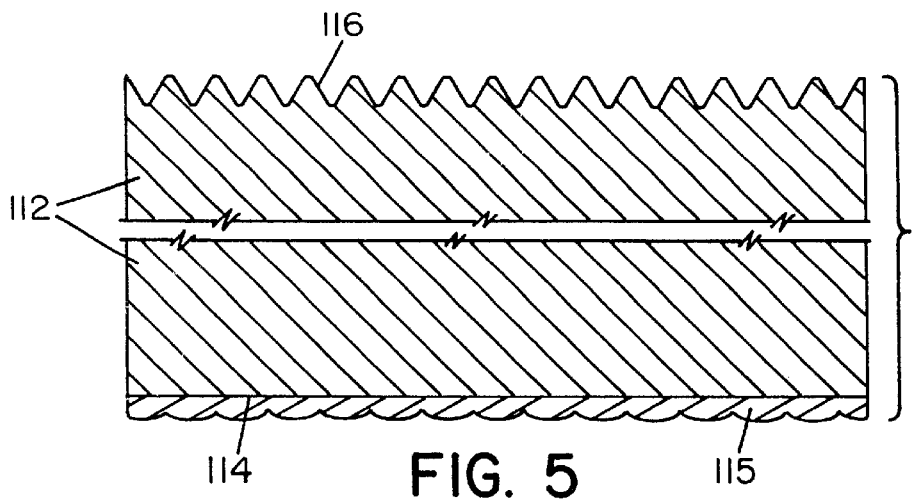
FIG. 5 is an enlarged cross-sectional view of a sheet of reverse treat copper foil having micronodules on the shiny side thereof.

FIG. 5 is a cross-sectional view of a reverse treated copper foil. The term "reverse treated copper foil" is conventionally used in the art to refer to a copper foil that is treated to produce micronodules of copper on the shiny side thereof. The micronodules are provided as an adhesion-promoting layer. Forming nodules as an adhesion-promoting layer on a shiny side or a matte side of a copper foil is conventionally known, and in and of itself forms no part of the present invention.

Figure 6:
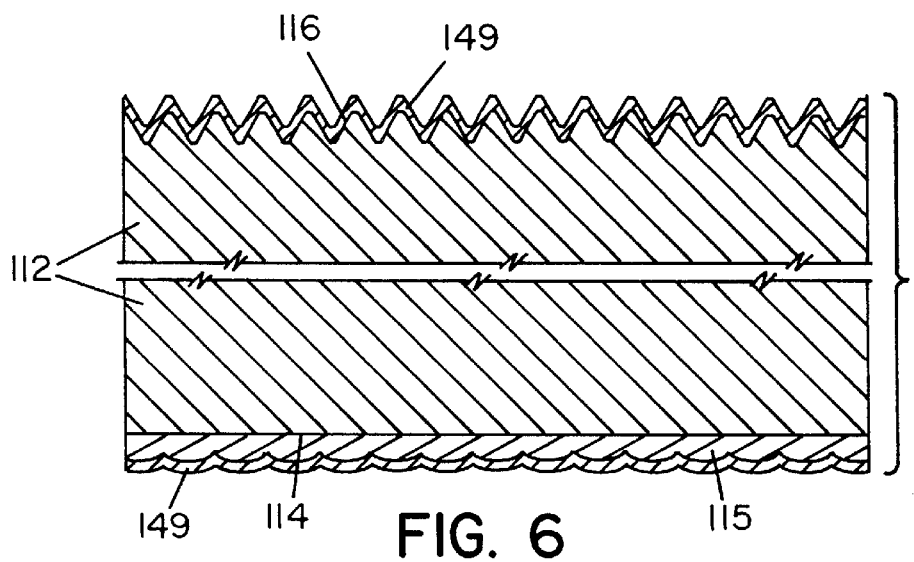
FIG. 6 is an enlarged cross-sectional view of the copper foil shown in FIG. 5 with a stabilization layer on the opposed surfaces thereof.
Figure 7:
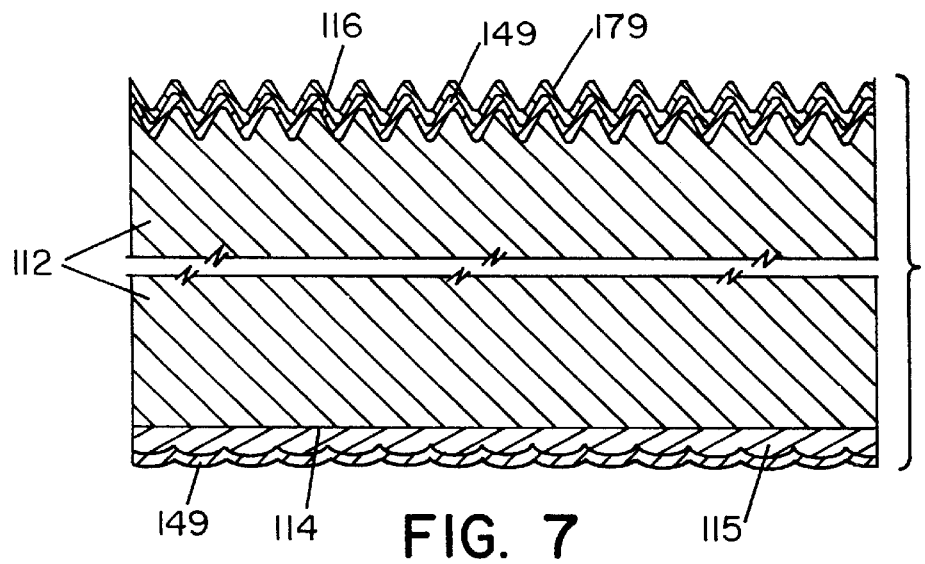
FIG. 7 is an enlarged cross-sectional view of the copper foil shown in FIG. 6 with a vapor deposited resistive layer on the matte side thereof.

In the embodiment shown in FIGS. 5–7, a base copper foil 112 having a matte side 116 and a shiny side 114 is treated to add micronodules 115 to shiny side 114. Reverse treated copper foil 112, best seen in FIG. 5, undergoes the same processes shown in FIG. 1. In this respect, copper foil 112 undergoes cleaning process 20 and rinsing process 30, as heretofore described, to remove copper oxide layers from the surfaces of copper foil 112. After cleaning process 20 and rinsing process 30, copper foil 112 undergoes stabilization process 40 wherein stabilization layers 149 are applied to each side of copper foil 112.

Copper foil 112 with stabilization layers 149 thereon then undergoes a drying process 60, as schematically shown in FIG. 1. Following application of stabilization layer 149, a resistive metal 179 is vacuum-deposited onto one stabilized surface of copper foil 112. In the embodiment shown in FIG. 7, the resistive metal 179 is applied to the stabilized, matte side 116 of copper foil 112. Alloys of nickel and chromium, or nickel and chromium together with aluminum and silicon as dopants, are known in forming resistive copper foils. Other types of metals and conductive materials, preferably having a volume resistivity greater than copper, may also be used in forming resistive layer(s) 179. By way of example and not limitation, platinum, tantalum, chromium, chromium silicide, tantalum nitrides and tantalum oxides may be used to form resistive layer(s) 179.

In accordance with the present invention, resistive material 179 is applied directly onto stabilization layers 149 by vacuum deposition techniques such as sputtering, chemical vapor deposition, electron beam deposition, thermal evaporation, ion plating (via substrate) or a combination of such processes. In the embodiment shown in FIG. 1, a sputtering process 70 is schematically illustrated. Preferably, deposition process 70 applies resistive alloy layer 179 onto the matte side 116 of copper foil 112 so as to have a thickness of between about 50 Å and 1,000 Å, and more preferably, between about 100 Å and 500 Å.

The following examples are provided for purposes of illustrating the invention. Unless otherwise indicated, in the following example as well as throughout the specification and claims, all parts and percentages are by weight, all temperatures are in degrees Celsius, and all pressures are atmospheric.

EXAMPLE 5

Both sides of a reverse treat electrodeposited copper foil 12 μm, are pretreated with stabilization layers as follows:
  Stabilization Treatment:
    0.53 g/l Zinc as $ZnSO_4$, 0.6 g/l Cr as $CrO_3$, 11 g/l $Na_2SO_4$
  Bath pH: 5.0
  Bath temperature: 42° C.
  Current density: 8–15 amps/ft$^2$ for matte side
    2–2.5 amps/ft$^2$ for shiny side
  Plating time: shiny side: 6–8 seconds
    matte side: -3–4 seconds
An alloy comprised of 80% nickel (Ni) and 20% chromium (Cr) is then applied to the stabilization layer(s) as follows:
  Ni/Cr Alloy Sputtering:
    14" sputter machine
  Power: 5–8 kilowatts
  Linear speed: 1.4 to 2.2 ft/min
  Ni/Cr Alloy Thickness: approximately 1000 Å for matte side
  Sheet Resistivity: approximately 160 Ω (ohms)/sq.

EXAMPLE 6

Both sides of a reverse treat electrodeposited copper foil 12 μm, are pretreated with stabilization layers as follows:

Stabilization Treatment:
  0.53 g/l Zinc as $ZnSO_4$, 0.6 g/l Cr as $CrO_3$, 11 g/l $Na_2SO_4$
Bath pH: 5.0
Bath temperature: 42° C.
Current density: 8–15 amps/ft² for matte side
  2–2.5 amps/ft² for shiny side
Plating time: shiny side: 6–8 seconds
  matte side: 3–4 seconds An alloy comprised of 56% nickel (Ni), 38% chromium (Cr) and with 2% aluminum (Al) and 4% silicon (Si) as dopants is then applied to the stabilization layer(s) as follows:

Ni/Cr/Al/Si Alloy Sputtering:
  14" sputter machine
  Power: 5–8 kilowatts
  Linear speed: 1.4 to 2.2 ft/min
  Ni/Cr/Al/Si Alloy Thickness: approximately 100 Å for matte side
  Sheet Resistivity: approximately 290 Ω (ohms)/sq.

Figure 8:
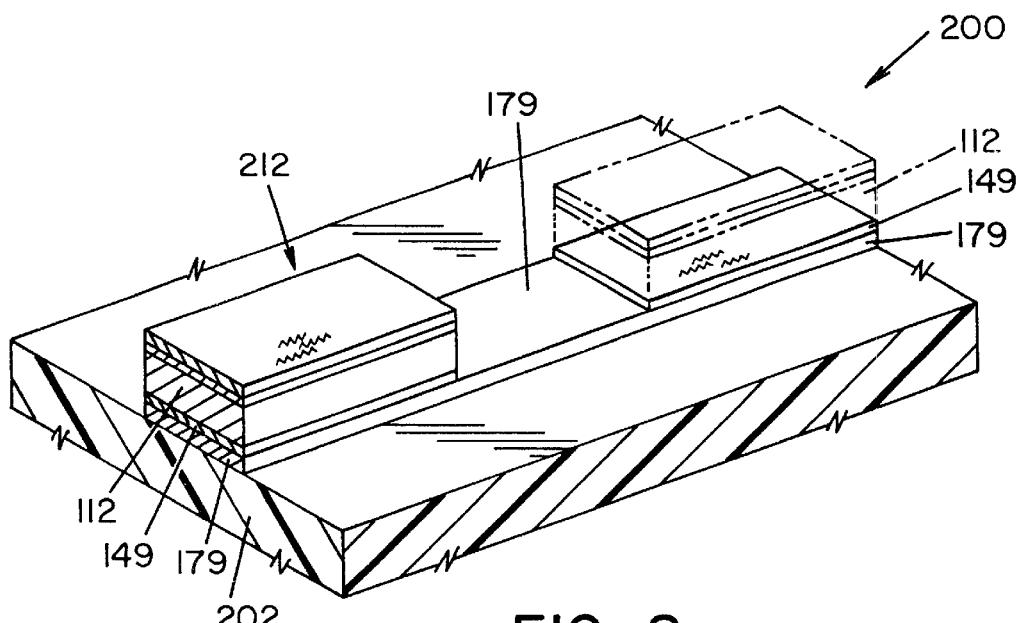
FIG. 8 is a top, perspective view of a resistive element formed from the resistive foil shown in FIG. 7.

FIG. 8 is a schematic view of a resistive element 200 formed from a resistive foil shown in FIG. 7. As with the other figures, the respective components of resistive element 200 are exaggerated for the purpose of illustration. The matte side of a resistive foil shown in FIG. 7 is adhered to substrate 202 by lamination by conventionally known techniques. Using conventionally known masking and etching techniques, a trace line 212 is formed along a portion of the surface of substrate 202. A section of copper layer 112 of trace line 212 is removed to leave only resistive layer 179 on substrate 202. The exposed portion of resistive layer 179 forms an electrical conductor between the separated ends of copper layer 112. Because the metal forming resistive layer 179 typically has a conductivity less than copper layer 112, it acts essentially as a resistor between the separated ends of copper layer 112. As will be appreciated by those skilled in the art, the thickness and width of resistive layer 179, as well as the spacing between the ends of copper layer 112, i.e., the length of the gap formed in trace line 212, will affect the resistance of resistive element 200.

Figure 9:
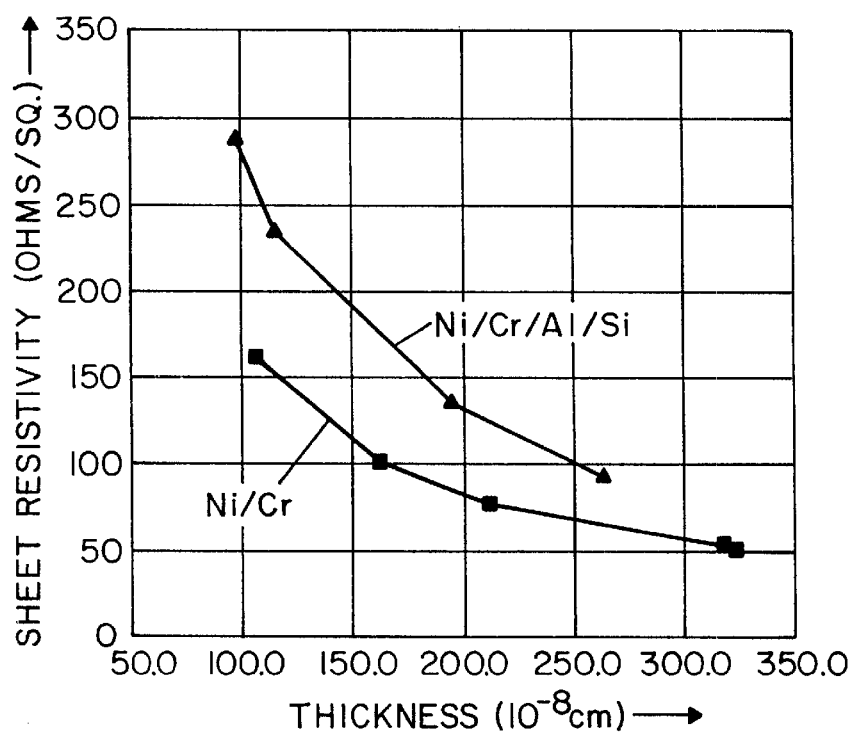
FIG. 9 is a graph contrasting sheet resistivity versus thickness for two resistive alloys.

FIG. 9 is a graph showing the relationship between the thickness of resistive layer 179 and the resistivity of the copper foil component for the nickel (Ni) and chromium (Cr) alloys discussed above. As shown in the graph, as the thickness of resistive layer 179 increases, the overall sheet resistivity goes down.

FIGS. 5–7 show a reverse treat copper foil having a resistive layer on the matte side thereof FIGS. 10–12A show that other types of resistive foils may be formed from other types of stabilized copper foils.

Figure 10:
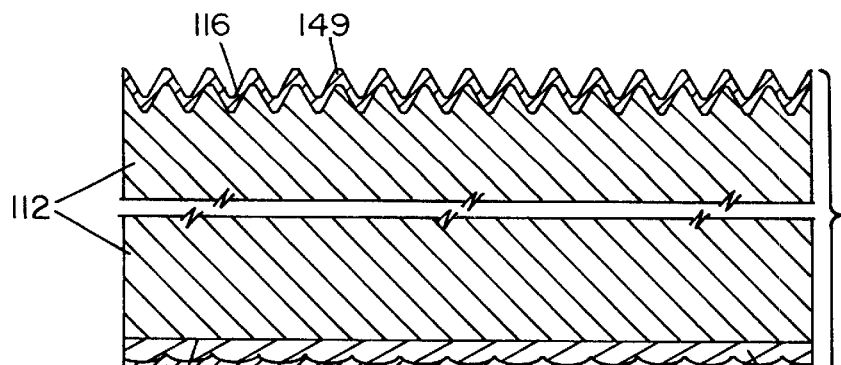
FIG. 10 is an enlarged, cross-sectional view of a sheet of reverse treat copper foil having micronodules on the shiny side thereof and a resistive layer vapor deposited on the micronodules.

FIG. 10 shows resistive foil formed from a reverse treat copper foil, similar to that of FIG. 7, having resistive layer 179 vapor deposited on micronodules 115 on the shiny side 114 of copper foil 112.

Figure 11:
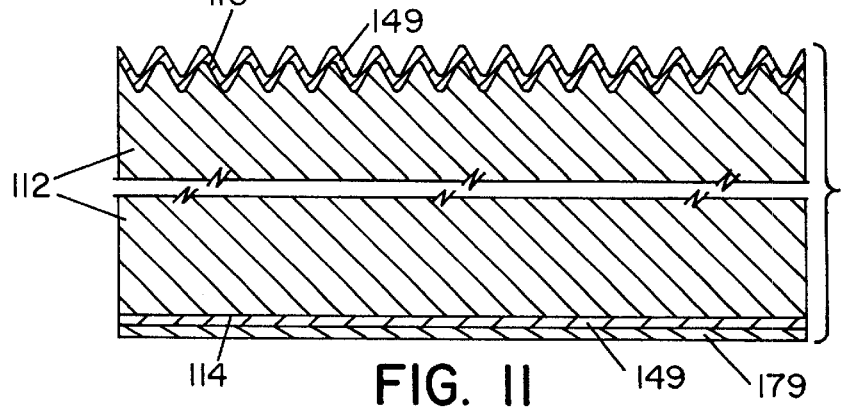
FIG. 11 is an enlarged, cross-sectional view of a sheet of conventional, electroformed copper foil having a vapor deposited resistive layer on the shiny side thereof.

FIG. 11 shows a conventional, electroformed copper foil 112, with no micronodule surface treatment. Copper foil is stabilized (layer 149) and has resistive layer 179 vapor deposited on shiny side 114 thereof.

Figure 12:
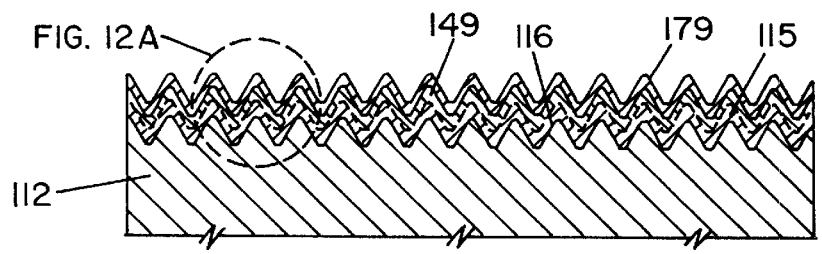
FIG. 12 is an enlarged, cross-sectional view of a matte side of a sheet of conventional copper foil, the matte side having micronodules thereon and a vapor deposited resistive layer on the micronodules.
Figure 12A:
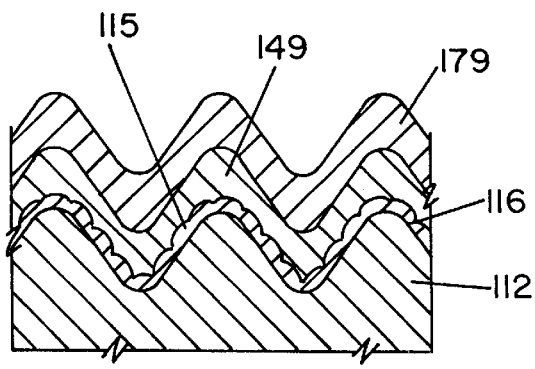
FIG. 12A is an enlarged view of area 12A of FIG. 12.

FIGS. 12 and 12A show a conventional, electroformed copper foil 112 having a micronodule surface treatment on matte side 116 thereof. The copper foil is stabilized as described above, and resistive layer 179 is vapor deposited on stabilized matte side 116.

The foregoing description is a specific embodiment of the present invention. It should be appreciated that this embodiment is described for purposes of illustration only, and that numerous alterations and modifications may be practiced by those skilled in the art without departing from the spirit and scope of the invention. For example, cleaning process 20 may not be required if process 10 is an extension of an electroforming process wherein virgin copper is being formed and directed into process line 10. Further, while the foregoing process has been described with respect to a copper foil, the process may be used to apply a metal, such as chromium, onto copper that is part of a copper coated polymer. It is intended that all such modifications and alterations be included insofar as they come within the scope of the invention as claimed or the equivalents thereof. pH–2 Bath temperature: 25° C. 10–30 amps/ft² for 5–10 seconds or dip treatment: 10 seconds Following stabilization process 40, copper foil 12 with stabilization layers 49 thereon then undergoes a rinse process, designated 50 in the drawings. Spray elements 52, disposed above and below copper foil 12, spray water onto the surfaces of copper foil 12 (with stabilization layers 49) to rinse and clean the same and to remove any residual electrolytic solution therefrom. A tank 54 disposed below spray nozzles 52 collects the rinsing solution.

Copper foil 12 with stabilization layers 49 thereon undergoes a drying process 60 schematically shown in FIG. 1. In the embodiment shown, forced air dryers 62 are disposed above and below copper foil 12 to direct air onto copper foil 12 to dry the surface thereof.

In accordance with the present invention, following application of stabilization layers 49, a metal is vacuum deposited onto one or both stabilized surfaces of copper foil 12. In the embodiment shown in FIG. 1, the metal is applied to matte side 16 of copper foil 12. The metal may be any metal capable of vacuum deposition including those selected from the group consisting of aluminum, nickel, chromium, copper, iron, indium, zinc, tantalum, tin, vanadium, tungsten, zirconium, molybdenum and alloys thereof In accordance with the present invention, the metal is vacuum deposited onto the stabilization layer 49 on copper foil 12 without additional cleaning or surface preparation. The metal is applied directly onto stabilization layer 49 by vacuum deposition techniques such as sputtering, chemical vapor deposition, electron beam deposition, thermal evaporation, ion plating (via substrate) or a combination of such processes. In the embodiment shown, a sputtering process 70 is schematically illustrated. As seen in FIG. 1, copper foil 12 with stabilization layers 49 thereon is conveyed into a deposition chamber designated 72. An electron beam gun 74 directs a stream of electrons at a target 76 comprised of a metal such that metallic species are knocked loose and deposited onto a surface of copper foil 12. In the embodiment shown, the deposition process applies a metal 79 onto the matte side of copper foil 12. The applied metal preferably has a thickness of between about 50 Å and 5,000 Å. In Having described the invention, the following is claimed:

1. A method of applying a resistive material onto a copper layer, comprising the steps of:
   stabilizing a surface of a copper layer by applying an oxide layer thereto, said oxide layer comprised of a material selected from a group consisting of zinc oxide chromium oxide, nickel oxide and a combination thereof and having a thickness of between about 5 Å and about 70 Å; and
   vapor depositing an electrically resistive material directly onto the oxide layer on said copper layer, said resistive material being selected from a group consisting of metals, metal alloys, metal nitrides, metal silicides or metal oxides.

2. A method as defined in claim 1, wherein said resistive material is comprised of an alloy formed primarily from chromium (Cr) and nickel (Ni).

3. A method as defined in claim 2, wherein said oxide layer is comprised of the combination of zinc oxide and chromium oxide.

4. A method as defied in claim 3, wherein said layer of copper is an electroformed copper foil having a matte side and a shiny side.

5. A method as defined in claim 4, wherein said copper foil is a reverse treat copper foil having a shiny side with a micronodule treatment applied thereto and a matte side, and said chromium/nickel alloy is applied to said matte side.

6. A method as defined in claim 1, wherein said oxide layer is comprised of chromium oxide.

7. A method as defined in claim 6, wherein said alloy is comprised by weight of about 80% nickel (Ni) and about 20% chromium (Cr).

8. A method as defined in claim 6, wherein said alloy is comprised by weight of about 56% nickel (Hi), about 38% chromium (Cr) and dopants comprised by weight of about 2% aluminum (Al) and about 4% silicon (Si).

9. A method as defined in claim 1, wherein said copper foil has a smooth surface and said resistive material is applied to said smooth surface.

10. A sheet material, comprised of:

a reverse treated copper foil having a matte side and a treated, shiny side that is treated to have micronodules formed thereon;

an oxide layer on one side of said copper foil, said oxide layer comprised of a material selected from a group consisting of zinc oxide, chromium oxide, nickel oxide and a combination thereof having a thickness between about 5 Å and about 70 Å; and a vapor deposited resistive material on said oxide layer.

11. A sheet material as defined in claim 10, wherein said oxide layer is on said matte side of said copper foil.

12. A sheet material as defined in claim 10, wherein said oxide layer is on said shiny side of said copper foil.

13. A sheet material as defined in claim 10, wherein said resistive material is an alloy comprised primarily of chromium (Cr) and nickel (Ni).

14. A sheet material as defined in claim 13, wherein said oxide layer is comprised of zinc oxide and chromium oxide.

15. A sheet material as defined in claim 13, wherein said oxide layer is comprised of chromium oxide.

16. A sheet material as defined in claim 10, wherein said resistive material is chromium and has a thickness of about 50 Å to about 1,000 Å.

17. A sheet material as defined in claim 10, wherein said alloy is comprised by weight of about 80% nickel (Ni) and about 20% chromium (Cr).

18. A sheet material as defined in claim 10, wherein said alloy is comprised by weight of about 56% nickel (Ni), about 38% chromium (Cr) and dopants comprised by weight of about 2% aluminum (Al) and about 4% silicon (Si).

* * * * *